United States Patent
Koh et al.

[11] Patent Number: 5,985,733
[45] Date of Patent: Nov. 16, 1999

[54] SEMICONDUCTOR DEVICE HAVING A T-SHAPED FIELD OXIDE LAYER AND A METHOD FOR FABRICATING THE SAME

[75] Inventors: Yo Hwan Koh; Jin Hyeok Choi, both of Kyoungkido, Rep. of Korea

[73] Assignee: Hyundai Electronics Industries Co., Ltd., Rep. of Korea

[21] Appl. No.: 08/883,242

[22] Filed: Jun. 26, 1997

[30] Foreign Application Priority Data

Jun. 29, 1996 [KR] Rep. of Korea .................... 96-26534

[51] Int. Cl.⁶ .................................................. H01L 21/76
[52] U.S. Cl. .......................... 438/410; 438/404; 438/405; 438/154; 438/165; 438/219; 438/225; 438/227; 438/425
[58] Field of Search ...................... 438/149, 154, 438/165, 219, 225, 227, 228, 297, 298, 223, 224, 425, 404, 405, 407, 410

[56] References Cited

U.S. PATENT DOCUMENTS

| | | |
|---|---|---|
| 4,903,108 | 2/1990 | Young et al. . |
| 5,137,837 | 8/1992 | Chang et al. ............................ 438/154 |
| 5,344,785 | 9/1994 | Jerome et al. ............................ 437/31 |
| 5,470,782 | 11/1995 | Schwalke et al. ...................... 438/405 |
| 5,517,047 | 5/1996 | Linn et al. . |
| 5,599,722 | 2/1997 | Sugisaka et al. . |
| 5,656,537 | 8/1997 | Iwamatsu et al. ...................... 438/404 |
| 5,807,771 | 9/1998 | Vu et al. ................................. 438/165 |

FOREIGN PATENT DOCUMENTS

| | | | |
|---|---|---|---|
| 31059820 | 3/1986 | Japan | H01L 21/20 |
| 07153835 | 11/1993 | Japan . | |
| 07122627 | 5/1995 | Japan | H01L 21/76 |

OTHER PUBLICATIONS

Translations of "VLSI Manufacturing Technology" by Taren Chuang p. 107 and p. 348.
Translation of "CMOS Digital IC" by Jengpang Kuo, p. 59. Semiconductor Device.

*Primary Examiner*—Trung Dang
*Attorney, Agent, or Firm*—Blakely Sokoloff Taylor & Zafman

[57] ABSTRACT

A semiconductor device having an adjacent P-well and N-well, such as a complementary metal oxide semiconductor (CMOS) transistor, on a silicon on insulator (SOI) substrate has a latch-up problem caused by the parasitic bipolar effect. This invention provides a semiconductor device removing the latch-up problem and methods for fabricating the same. A semiconductor device according to the present invention has a T-shaped field oxide layer connected to a buried oxide layer of the SOI substrate to prevent the latch-up problem.

12 Claims, 5 Drawing Sheets

SEMICONDUCTOR DEVICE HAVING A T-SHAPED FIELD OXIDE LAYER AND A METHOD FOR FABRICATING THE SAME

BACKGROUND OF THE INVENTION

1. Field of the Invention

The present invention relates to a semiconductor device, such as a complementary metal oxide semiconductor (CMOS) transistor, having a P-well and an N-well on a Silicon-On-Insulator (hereinafter, referred to as SOI) substrate, and more particularly to a semiconductor device capable of removing the latch-up problem due to the complete isolation between the wells and a method for fabricating the same.

2. Description of the Prior Art

Generally, a high speed memory device is formed on an SOI substrate. The SOI substrate is made of a buried oxide layer formed on a silicon substrate and a single crystal silicon layer formed on the buried oxide layer. In an SOI substrate the parasitic capacitance of the devices is reduced due to the buried oxide layer, and therefore the device switching speed may increase.

However, the transistor formed on the SOI substrate has no bulk electrode (ground terminal) in the single crystal layer, so that the parasitic bipolar effect occurs, thereby causing a large leakage current between the adjacent PNP and NPN bipolar transistors. This is called the latch-up. Therefore, the break down voltage of the transistor is lowered and the characteristics of the transistor are degraded by the hot electrons. As a result, the reliability of device is deteriorated.

A conventional method to solve the above mentioned problem will be described with reference to FIG. 1. As shown in FIG. 1, a buried oxide layer 11 and a single crystal silicon layer 12 are formed on a predetermined region of a silicon substrate 10. Impurities are diffused into the single crystal silicon layer 12 to form wells. Thereafter, a field oxide layer 13 is formed on the single crystal silicon layer 12 by the thermal oxidation process and a field stop ion implantation layer 14 is formed beneath the field oxide layer 13 to prevent the leakage current from passing through the single crystal silicon layer 12. A gate oxide layer 15 and a polysilicon layer 16 for a gate are formed on each well and then impurities are implanted into the single crystal silicon layer 12 to form source/drain regions (not shown). An oxide layer is formed on the resulting structure and etched without an etching mask so as to form spacers 17 on the sidewalls of the gate electrode.

Herein, the field oxide layer 13 is formed by the local oxidation of silicon (LOCOS) process leaving the single crystal silicon layer 12 to a thickness of 100 Å to 1000 Å between the field oxide layer 13 and the buried oxide layer 11. The remaining single crystal silicon layer 12 is doped so as to form the field stop ion implantation layer 14, which plays the role of a well electrode. That is to say, voltage is induced from the well to the region beneath the gate through the remaining silicon layer, and as a result, voltage at the region beneath the gate does not increase. However, the wells are not completely isolated by the field oxide layer formed according to the above mentioned conventional method, and therefore the latch-up problem is not effectively prevented.

SUMMARY OF THE INVENTION

Therefore, the object of the present invention is to provide a semiconductor device preventing the latch up problem by reducing the leakage current, and a method for fabricating the same.

In accordance with an aspect of the present invention, there is disclosed a semiconductor device comprising: a semiconductor substrate; an insulating layer formed on said semiconductor substrate; a semiconductor layer formed on said insulating layer, including an N-well and a P-well; and a T-shaped device isolation layer formed between said N-well and said P-well, wherein a bottom portion of said T-shaped device isolation layer is connected with said insulating layer.

In accordance with another aspect of the present invention, there is disclosed a semiconductor device comprising: a semiconductor substrate; an insulating layer formed on said semiconductor substrate; a semiconductor layer formed on said insulating layer, including an N-well and a P-well; and a first device isolation layer vertically formed on said insulating layer between said N-well and said P-well; and a second device isolation layer horizontally formed in sad semiconductor layer between said N-well and said P-well, thereby forming a T-shaped device isolation layer with said first device isolation layer.

In accordance with further another aspect of the present invention, there is disclosed a method for fabricating a semiconductor devices having plurality of wells, comprising the steps of: forming wells in a silicon layer on a SOI wafer which has a buried oxide layer and a silicon layer on a silicon substrate; forming a silicon nitride layer on said silicon layer; selectively etching said silicon nitride layer to form a first opening on a boundary region between said wells; forming photoresist patterns on the resulting structure, wherein said first opening is not entirely covered; etching said silicon layer to form a second opening using said photoresist patterns as an etching mask, exposing a portion of said buried oxide layer, so that a width of said second opening is smaller than that of said first opening; removing said photoresist patterns; and forming a field oxide layer in said first and second opening, wherein a portion of said field oxide layer is connected to said buried oxide layer.

In accordance with still further another aspect of the present invention, there is disclosed a method for fabricating a semiconductor devices having plurality of wells, comprising the steps of: forming wells in said silicon layer on a SOI wafer which has buried oxide layer and a silicon layer on silicon substrate; forming a silicon nitride layer on said silicon layer; selectively etching said silicon nitride layer to form a first opening on the boundary region between said wells; forming a field oxide layer in said first opening; etching a portion of the said field oxide layer and said silicon layer to form a second opening; and filling with a dielectric layer said second opening.

BRIEF DESCRIPTION OF THE DRAWINGS

These and other objects, features and advantages of the present invention will be more fully apparent from the description of the preferred embodiments with reference to the accompanying drawings in which.

DETAILED DESCRIPTION OF THE PREFERRED EMBODIMENTS

An embodiment according to the present invention will be described below with reference to FIGS. 2A to 2C.

Figure 1:
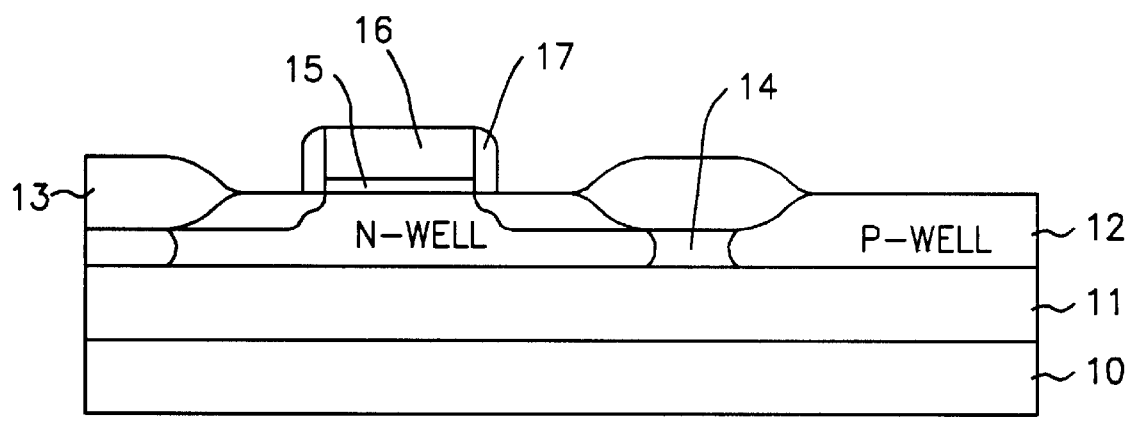
FIG. 1 is a cross sectional view of a semiconductor device having an adjacent P-well and N-well, according to a conventional method.
Figure 2A:
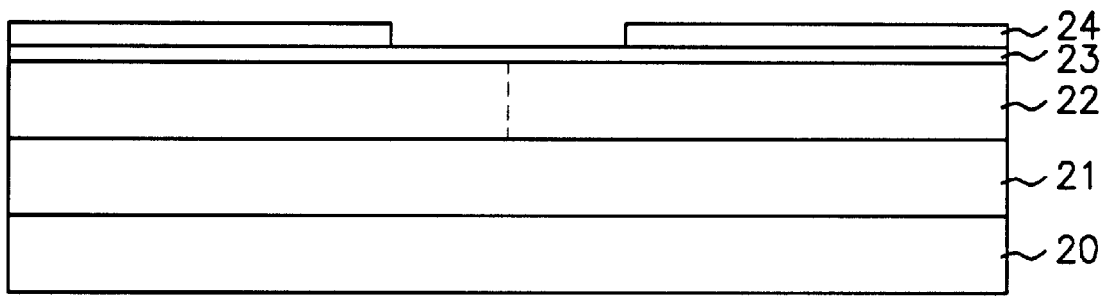
FIGS. 2A to 2C are cross sectional views of a semiconductor device having an adjacent P-well and N-well, according to an embodiment of the present invention.

First, referring to FIG. 2A, a buried oxide layer 21 and a single crystal silicon layer 22 are formed on a silicon substrate 20. Impurities are diffused into the single crystal silicon layer 22 to form wells. Thereafter, a pad oxide layer 23 and a silicon nitride layer 24 are formed, in order, on the resulting structure. The silicon nitride layer 24 is selectively etched to form an opening for forming a field oxide layer in the boundary region between the wells.

Figure 2B:
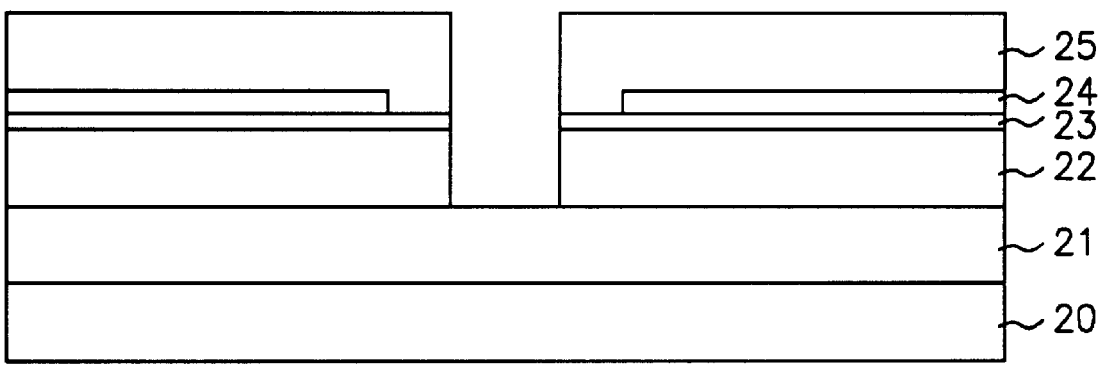

Referring to FIG. 2B, a photoresist pattern 25 opening the boundary region between the wells is formed on the resulting structure. The pad oxide layer 23 and the single crystal silicon layer 22 are etched so as to expose a predetermined region of the buried oxide layer 21 using the photoresist pattern 25 as an etching mask.

Figure 2C:
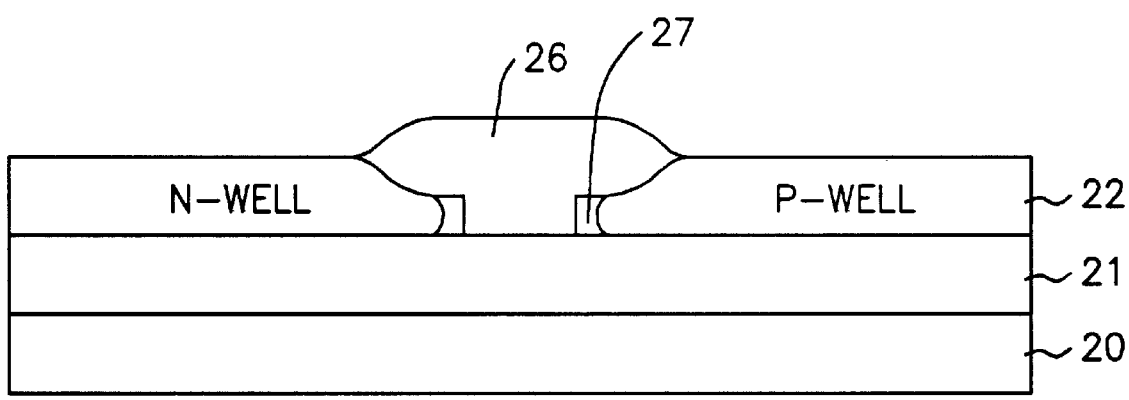

Referring to FIG. 2C, a field oxide layer 26 is formed on the buried oxide layer 21 by the LOCOS (local oxidation of silicon) process. Herein, the opening formed by the photoresist pattern 25 is smaller than the opening formed in etching the silicon nitride layer 24. Therefore, because the top portion of the field oxide layer 26 is narrow and the bottom portion thereof is wide, the field oxide layer 26 is T-shaped. Accordingly the bottom portion of the field oxide layer 26 is connected with exposed buried oxide layer 21. This T-shaped field oxide layer 26 formed by the thermal oxidation process may compensate for damage generated in its etching process. Thereafter, the field oxide layer 26 is implanted with ions so as to form an ion-doped layer 27 beneath the field oxide layer. In the preferred embodiment of the present invention, the ion-doped layer 27 may be formed between the bottom of the field oxide layer 26 and a side of the well. The ion-doped layer 27 reduces the leakage current and the field oxide layer 26 connected to the buried oxide layer 21 effectively isolates the wells from each other, therefore the latch-up problem may be removed.

Another embodiment according to the present invention will described below with reference to FIGS. 3A to 3C.

Figure 3A:
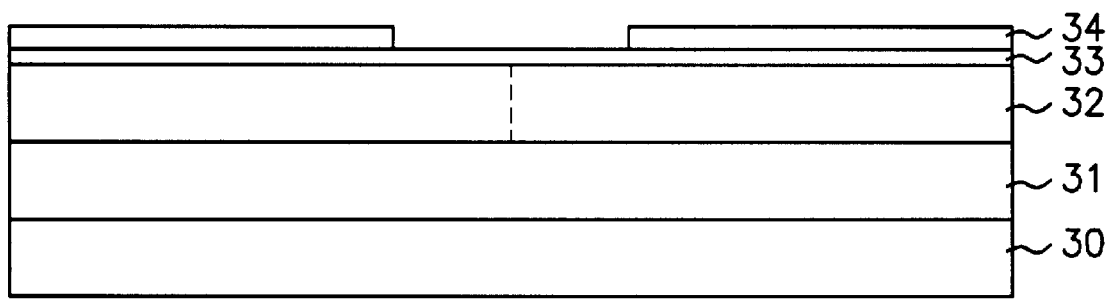
FIGS. 3A to 3C are cross sectional views of a semiconductor device having an adjacent P-well and N-well, according to another embodiment of the present invention.

First, referring to FIG. 3A, a buried oxide layer 31 and an undoped single crystal layer 32 are formed on a silicon substrate 30. Subsequently, impurities are diffused into the single crystal silicon layer 32 to form wells. A pad oxide layer 33 and a silicon nitride layer 34 are formed, in order, on the resulting structure. The silicon nitride layer 34 is selectively etched to form an opening for forming a field oxide layer in the boundary region between the wells.

Figure 3B:
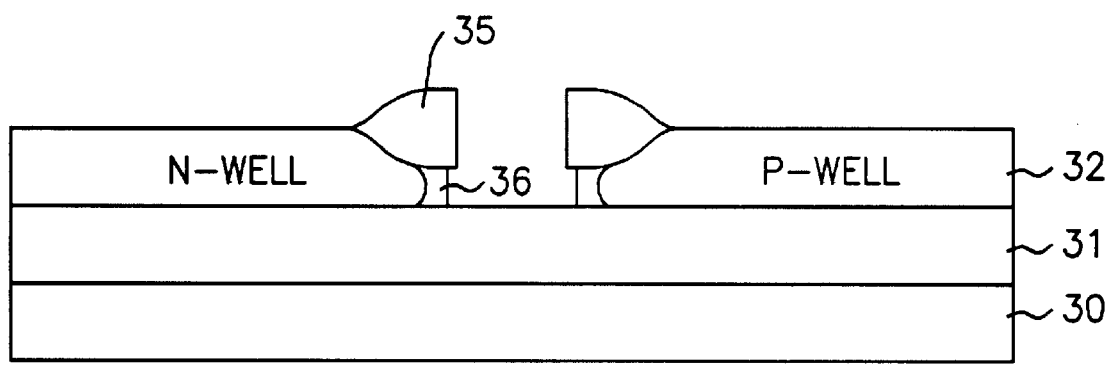

Referring to FIG. 3B, the field oxide layer 35 is formed in the opening of the boundary region between the wells. The field oxide layer 35 is implanted with ions so as to form an ion-doped layer 36 beneath the field oxide layer 35. Accordingly, the field oxide layer 35 according to another embodiment of the present invention has the same T-shaped oxide layer as the field oxide layer 24 according to an embodiment of the present invention. The ion-doped layer 36 reduces the leakage current. Thereafter, the field oxide layer 35 and the single crystal silicon layer 32 are selectively etched so as to form an opening exposing the buried oxide layer 31 in the boundary region between the wells.

Figure 3C:
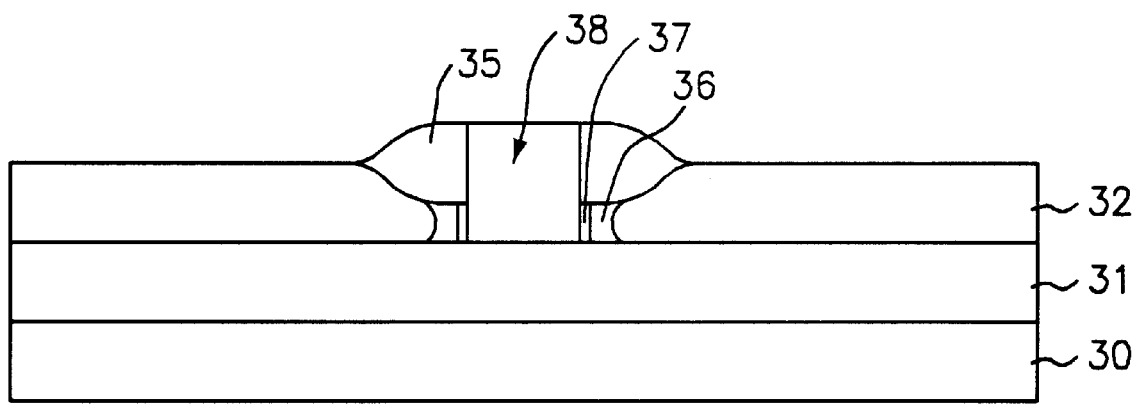

Referring to FIG. 3C, an oxide layer 37 is formed by the thermal oxidation process in a portion of the opening so as to compensate for damages generated in the etching process. Thereafter, the opening is filled with a dielectric layer 38, such as a silicon oxide layer or a silicon nitride layer. The dielectric layer 38 is connected to the buried oxide layer so as to completely isolate the wells, and therefore the latch-up problem can be solved.

Although the preferred embodiments of the present invention have been disclosed for illustrative purposes, those skilled in the art will appreciate that various modifications, additions and substitutions are possible, without departing from the scope and the spirit of the present invention as disclosed in the accompanying claims.

What is claimed is:

1. A method for fabricating a semiconductor devices having plurality of wells, comprising the steps of:

forming a buried oxide layer and a silicon layer on a silicon substrate;

forming wells in said silicon layer;

forming a silicon nitride layer on said silicon layer;

selectively etching said silicon nitride layer to form a first opening on a boundary region between said wells;

forming photoresist patterns on the resulting structure, wherein said first opening is not entirely covered;

etching said silicon layer to form a second opening using said photoresist patterns as an etching mask, exposing a portion of said buried oxide layer, so that a width of said second opening is smaller than that of said first opening;

removing said photoresist patterns; and forming a field oxide layer in said first and second opening, wherein a portion of said field oxide layer is connected to said buried oxide layer.

2. A method in accordance with claim 1, wherein said method further comprises the step of forming ion-doped layers between said field oxide layer and said buried oxide layer.

3. A method in accordance with claim 1, wherein said silicon layer is a single crystal silicon layer.

4. A method in accordance with claim 2, wherein said ion-doped layer is formed by implanting ions into said silicon layer beneath said field oxide layer.

5. A method in accordance with claim 1, wherein said method further comprises the step of forming a pad oxide layer on said silicon layer.

6. A method for fabricating a semiconductor devices having plurality of wells, comprising the steps of:

forming a buried oxide layer and a silicon layer on a silicon substrate;

forming wells in said silicon layer;

forming a silicon nitride layer on said silicon layer;

selectively etching said silicon nitride layer to form a first opening on the boundary region between said wells;

forming a field oxide layer in said first opening;

etching a portion of the said field oxide layer and said silicon layer to form a second opening; and filling with a dielectric layer said second opening.

7. A method in accordance with claim 6, wherein the step of filling said second opening with said dielectric layer further comprises the step of forming an oxide layer on side walls of said exposed wells.

8. A method in accordance with claim 6, wherein said dielectric layer is one of a silicon nitride layer and a silicon oxide layer.

9. A method in accordance with claim 6, wherein said silicon layer is a single crystal silicon layer.

10. A method in accordance with claim 6, wherein said method further comprises the step of forming a pad oxide layer on said silicon layer.

11. A method in accordance with claim 6, wherein said method further comprises the step of forming ion-doped layers between said field oxide layer and said buried oxide layer.

12. A method in accordance with claim 11, wherein said ion-doped layer is a doped silicon layer formed by implanting ions into said silicon layer beneath said field oxide layer.

* * * * *